(12) United States Patent  (10) Patent No.: US 8,314,462 B2
Hull et al.  (45) Date of Patent: Nov. 20, 2012

(54) SEMICONDUCTOR DEVICES INCLUDING ELECTRODES WITH INTEGRATED RESISTANCES

(75) Inventors: Brett Adam Hull, Raleigh, NC (US); Sei-Hyung Ryu, Cary, NC (US); James Theodore Richmond, Hillsborough, NC (US)

(73) Assignee: Cree, Inc., Durham, NC (US)

( * ) Notice: Subject to any disclaimer, the term of this patent is extended or adjusted under 35 U.S.C. 154(b) by 238 days.

(21) Appl. No.: 12/510,523

(22) Filed: Jul. 28, 2009

(65) Prior Publication Data

US 2011/0024834 A1  Feb. 3, 2011

(51) Int. Cl.
 *H01L 27/12* (2006.01)
(52) U.S. Cl. ............... 257/350; 257/381; 257/E29.256
(58) Field of Classification Search ............. 257/335, 257/E29.256, 364, 379, 380, 381, 538, E21.004, 257/E29.112, E29.141, E29.156, 336–343, 257/154, 350, 358, 359
See application file for complete search history.

(56) References Cited

U.S. PATENT DOCUMENTS

| | | | | |
|---|---|---|---|---|
| 4,157,563 A | * | 6/1979 | Bosselaar | 257/489 |
| 4,194,174 A | * | 3/1980 | DeLise | 338/308 |
| 4,290,185 A | * | 9/1981 | McKenny et al. | 438/238 |
| 4,701,241 A | * | 10/1987 | Schlesier | 216/16 |
| 4,920,388 A | * | 4/1990 | Blanchard et al. | 257/341 |
| 4,948,747 A | * | 8/1990 | Pfiester | 438/384 |
| 5,141,597 A | * | 8/1992 | Adams et al. | 438/384 |
| 5,506,421 A | | 4/1996 | Palmour | |
| 5,670,820 A | * | 9/1997 | Campbell et al. | 257/538 |
| 6,023,086 A | | 2/2000 | Reyes et al. | |
| 6,566,185 B2 | * | 5/2003 | Inoue et al. | 438/238 |
| 6,653,659 B2 | | 11/2003 | Ryu et al. | |
| 6,933,560 B2 | * | 8/2005 | Lee et al. | 257/328 |
| 6,956,238 B2 | | 10/2005 | Ryu et al. | |
| 7,074,643 B2 | | 7/2006 | Ryu | |
| 7,115,946 B2 | * | 10/2006 | Kawaguchi et al. | 257/339 |
| 7,381,992 B2 | | 6/2008 | Ryu | |
| 7,485,924 B2 | * | 2/2009 | Takimoto et al. | 257/339 |
| 2002/0125511 A1 | * | 9/2002 | Shimotsusa | 257/288 |
| 2003/0155585 A1 | * | 8/2003 | Kozuka et al. | 257/200 |
| 2008/0105949 A1 | | 5/2008 | Zhang et al. | |

FOREIGN PATENT DOCUMENTS

| | | |
|---|---|---|
| EP | 0 287 195 | 10/1988 |
| EP | 0 736 907 | 10/1996 |
| JP | 02042764 | 2/1990 |
| JP | 05055588 | 3/1993 |
| JP | 62098670 | 5/1997 |

OTHER PUBLICATIONS

U.S. Appl. No. 12/412,448, filed Mar. 27, 2009, Brett Adam Hull et al.
International Search Report and Written Opinion (14 pages) corresponding to International Application No. PCT/US2010/035184; Mailing Date: Aug. 4, 2010.
International Preliminary Report on Patentability Corresponding to International Application No. PCT/US2010/035184; Date of Mailing: Oct. 27, 2011; 18 pages.

* cited by examiner

*Primary Examiner* — Matthew Landau
*Assistant Examiner* — Joseph C Nicely
(74) *Attorney, Agent, or Firm* — Myers Bigel Sibley & Sajovec, P.A.

(57) ABSTRACT

A semiconductor device may include an insulating layer and a semiconductor electrode on the insulating layer. An area of increased electrical resistance may separate a contact area of the semiconductor electrode from an active area of the semiconductor electrode. In addition, a metal contact may be provided on the contact area of the semiconductor electrode opposite the insulating layer.

19 Claims, 7 Drawing Sheets

SEMICONDUCTOR DEVICES INCLUDING ELECTRODES WITH INTEGRATED RESISTANCES

STATEMENT OF GOVERNMENT RIGHTS

This invention was made with Government support under US Army Contract No. W911NF-04-2-0021 awarded by US Army Research Laboratory. The Government has certain rights in the invention.

FIELD OF THE INVENTION

This invention relates to electronics, and more particularly to semiconductor devices including gate electrodes and related methods.

BACKGROUND

Semiconductor power devices are widely used to carry large currents and support high voltages. Modern semiconductor power devices are generally fabricated from monocrystalline silicon semiconductor material. One widely used power device is the power Metal Oxide Semiconductor Field Effect Transistor (MOSFET). In a power MOSFET, a control signal is supplied to an insulated gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may have a lateral structure or a vertical structure. In a lateral structure, the drain, gate and source terminals are on the same surface of a substrate. In contrast, in a vertical structure, the source and drain are on opposite surfaces of the substrate.

Recent development efforts in power devices have also included investigation of the use of silicon carbide (SiC) devices for power devices. Silicon carbide has a wide bandgap, a lower dielectric constant, a high breakdown field strength, a high thermal conductivity, and a high saturation electron drift velocity compared to silicon. These characteristics may allow silicon carbide power devices to operate at higher temperatures, higher power levels and/or with lower specific on-resistance than conventional silicon-based power devices. A theoretical analysis of the superiority of silicon carbide devices over silicon devices is found in a publication by Bhatnagar et al. entitled "Comparison of 6H—SiC, 3C—SiC and Si for Power Devices", IEEE Transactions on Electron Devices, Vol. 40, 1993, pp. 645-655. A power MOSFET fabricated in silicon carbide is described in U.S. Pat. No. 5,506,421 to Palmour entitled "Power MOSFET in Silicon Carbide" and assigned to the assignee of the present invention.

A number of silicon carbide power MOSFET structures have been described in the literature. See e.g. U.S. Pat. No. 5,506,421; A. K. Agarwal, J. B. Casady, L. B. Rowland, W. F. Valek, M. H. White, and C. D. Brandt, "1.1 kV 4H—SiC Power UMOSFET's," IEEE Electron Device Letters, Vol. 18, No. 12, pp. 586-588, Dec. 1997; A. K. Agarwal, J. B. Casady, L. B. Rowland, W. F. Valek and C. D. Brandt, "1400 V 4H—SiC Power MOSFETs," Materials Science Forum Vols. 264-268, pp. 989-992, 1998; J. Tan, J. A. Cooper, Jr., and M. R. Melloch, "High-Voltage Accumulation-Layer UMOS-FETs in 4H—SiC," IEEE Electron Device Letters, Vol. 19, No. 12, pp. 487-489, Dec. 1998; J. N. Shenoy, J. A. Cooper and M. R. Melloch, "High-Voltage Double-Implanted Power MOSFET's in 6H—SiC," IEEE Electron Device Letters, Vol. 18, No. 3, pp. 93-95, March 1997; J. B. Casady, A. K. Agarwal, L. B. Rowland, W. F. Valek, and C. D. Brandt, "900 V DMOS and 1100 V UMOS 4H—SiC Power FETs," IEEE Device Research Conference, Ft. Collins, Colo., Jun. 23-25, 1997; R. Schorner, P Friedrichs, D. Peters, H. Mitlehner, B. Weis and D. Stephani, "Rugged Power MOSFETs in 6H—SiC with Blocking Capability up to 1800 V," Materials Science Forum Vols. 338-342, pp. 1295-1298, 2000; V. R. Vathulya and M. H. White, "Characterization of Channel Mobility on Implanted SiC to determine Polytype suitability for the Power DIMOS structure," Electronic Materials Conference, Santa Barbara, Calif., Jun. 30-Jul. 2, 1999; A. V. Suvorov, L. A. Lipkin, G. M. Johnson, R. Singh and J. W. Palmour, "4H—SiC Self-Aligned Implant-Diffused Structure for Power DMOSFETs," Materials Science Forum Vols. 338-342, pp. 1275-1278, 2000; P. M. Shenoy and B. J. Baliga, "The Planar 6H—SiC ACCUFET: A New High-Voltage Power MOSFET Structure," IEEE Electron Device Letters, Vol. 18, No. 12, pp. 589-591, Dec. 1997; Ranbir Singh, Sei-Hyung Ryu and John W. Palmour, "High Temperature, High Current, 4H—SiC Accu-DMOSFET," Materials Science Forum Vols. 338-342, pp. 1271-1274, 2000; Y. Wang, C. Weitzel and M. Bhatnagar, "Accumulation-Mode SiC Power MOSFET Design Issues," Materials Science Forum Vols. 338-342, pp. 1287-1290, 2000; A. K. Agarwal, N. S. Saks, S. S. Mani, V. S. Hegde and P. A. Sanger, "Investigation of Lateral RESURF, 6H—SiC MOSFETs," Materials Science Forum Vols. 338-342, pp. 1307-1310, 2000; and Shenoy et al., "High-Voltage Double-Implanted Power MOSFET's in 6H—SiC," IEEE Electron Device Letters, Vol. 18, No. 3, March 1997, pp. 93-95.

One widely used silicon power MOSFET is the double diffused MOSFET (DMOSFET) that is fabricated using a double-diffusion process. A conventional DMOSFET in silicon is illustrated in FIG. 8. In the device of FIG. 8, a p-base region 514 and an n$^+$ source region 516 are diffused in a substrate 512 through a common opening in a mask. The p-base region 514 is driven in deeper than the n$^+$ source region 516. The difference in the lateral diffusion between the p-base 514 and n$^+$ source regions 516 forms a surface channel region. A gate oxide 518 is provided on the substrate 512 and a gate electrode 520 is provided on the gate oxide 518. A source contact 522 is provided on the substrate 512 on and between the n$^+$ source regions 516. A drain contact 524 is provided on the substrate 512 opposite the source contact 522. An overview of power MOSFETs including DMOSFETs may be found in the textbook entitled "Power Semiconductor Devices" by B. J. Baliga, published by PWS Publishing Company, 1996, and specifically in Chapter 7, entitled "Power MOSFET", the disclosure of which is hereby incorporated herein by reference. The DMOSFET structure has also been fabricated in silicon carbide. Because of the low diffusion of dopants in silicon carbide, however, other doping techniques, such as ion implantation, have been used in fabricating DMOSFETs in silicon carbide. See, for example, the reference by Shenoy et al. entitled "High-Voltage Double-Implanted Power MOSFET's in 6H—SiC", IEEE Electron Device Letters, Vol. 18, No. 3, Mar. 1997, pp. 93-95. Thus, the term "DMOSFET" is used herein to refer to a structure similar to that of FIG. 8 having a base or well region and source regions in the base or well region irrespective of the methods used in fabricating the structure.

SUMMARY

According to some embodiments of the present invention, a semiconductor device may include an insulating layer and a semiconductor electrode on the insulating layer. An area of increased electrical resistance may separate a contact area of the semiconductor electrode from an active area of the semiconductor electrode. In addition, a metal contact may be provided on the contact area of the semiconductor electrode opposite the insulating layer.

The area of increased electrical resistance may include a plurality of perforations through the semiconductor electrode. Accordingly, the semiconductor electrode may define a plurality of separate and parallel electrical paths between the plurality of perforations through the semiconductor electrode. In alternatives, the area of increased electrical resistance may include an area of reduced thickness of the semiconductor electrode relative to thicknesses of the contact and active areas of the semiconductor electrode, or the area of increased electrical resistance may include an area of reduced conductivity relative to conductivities of the contact and active areas of the semiconductor electrode.

The area of increased electrical resistance may surround the contact area of the semiconductor electrode. Moreover, the semiconductor electrode may be a polycrystalline semiconductor electrode such as a polycrystalline silicon electrode.

In addition, the insulating layer may be between the semiconductor layer having a first conductivity type and the semiconductor electrode, and the semiconductor layer may include active and contact areas corresponding to active and contact areas of the semiconductor electrode. A well region having a second conductivity type (different than the first conductivity type) may be provided in the active area of the semiconductor layer. A source/drain terminal region having the first conductivity type may be provided adjacent at least portions of the well region. Moreover, portions of the well region between the source/drain terminal region and an outer perimeter of the well region adjacent a surface of the semiconductor layer may define a channel with the semiconductor electrode on portions of the insulating layer opposite the channel.

According to other embodiments of the present invention, a semiconductor device may include a semiconductor layer having a first conductivity type, and the semiconductor layer may include an active area and a gate contact area. A well region may have a second conductivity type in the active area, and the first and second conductivity types may be different. A source/drain terminal region may have the first conductivity type adjacent at least portions of the well region, and portions of the well region between the source/drain terminal region and an outer perimeter of the well region may define a channel. A gate insulating layer may be provided on the channel, on the active area outside the well region, and on the gate contact area. In addition, a gate electrode may be provided on the gate insulating layer opposite the channel, opposite the active area outside the well region, and opposite the gate contact area, with the gate electrode including an area of increased electrical resistance between the gate contact area and the channel.

The area of increased electrical resistance may include a plurality of perforations through the gate electrode. Accordingly, the gate electrode may define a plurality of separate and parallel electrical paths between the plurality of perforations through the gate electrode. According to other embodiments of the present invention, the area of increased electrical resistance may include an area of reduced thickness of the gate electrode relative to thicknesses of other portions of the gate electrode, or the area of increased electrical resistance may include an area of reduced conductivity relative to conductivities of other portions of the gate electrode.

A metal contact may be provided on the gate electrode opposite the gate contact area of the semiconductor layer, and the area of increased electrical resistance may surround an area of contact between the metal contact and the gate electrode. Moreover, the gate electrode may be a semiconductor gate electrode, such as a polycrystalline semiconductor gate electrode, and more particularly, a polycrystalline silicon gate electrode.

The well region may be a first well region, the source/drain terminal region may be a first source/drain terminal region, and the channel may be a first channel. In addition, a second well region having the second conductivity type may be spaced apart from the first well region in the active area. Furthermore, a second source/drain terminal region having the first conductivity type may be adjacent at least portions of the second well region with portions of the second well region between the second source/drain terminal region and an outer perimeter of the second well region defining a second channel. The gate insulating layer may be on the first and second channels and on the active area between the first and second well regions, and the gate electrode may be on the gate insulating layer opposite the first and second channels and opposite the active area between the first and second well regions.

In addition, a first source/drain electrode may be coupled to the first and second source/drain regions, and the first source/drain electrode and the gate electrode may be electrically isolated. A second source/drain electrode may be on the semiconductor layer with the semiconductor layer between the first and second source/drain electrodes.

According to still other embodiments of the present invention, a semiconductor device may include a semiconductor layer including a channel and a terminal region adjacent the channel. A gate electrode may include an active area on the channel, a contact area, and an area of increased electrical resistance between the contact area and the active area. A metal contact may also be provided on the contact area of the gate electrode opposite the semiconductor layer.

The area of increased electrical resistance may include a plurality of perforations through the gate electrode. The area of increased electrical resistance may include an area of reduced thickness of the gate electrode relative to thicknesses of portions of the gate electrode on opposite sides of the area of increased electrical resistance. The area of increased electrical resistance may include an area of reduced conductivity relative to conductivities of portions of the gate electrode on opposite sides of the area of increased electrical resistance.

The channel may be a first channel, the terminal region may be a first source/drain terminal region, and the semiconductor layer may include a second channel and a second source/drain terminal region adjacent the second channel. Moreover, the active area of the gate electrode may be on the first and second channels, and the area of increased electrical resistance may be between the contact area and both of the first and second channels. In addition, a gate insulating layer may be between the gate electrode and the semiconductor layer.

DETAILED DESCRIPTION

Figure 1A:
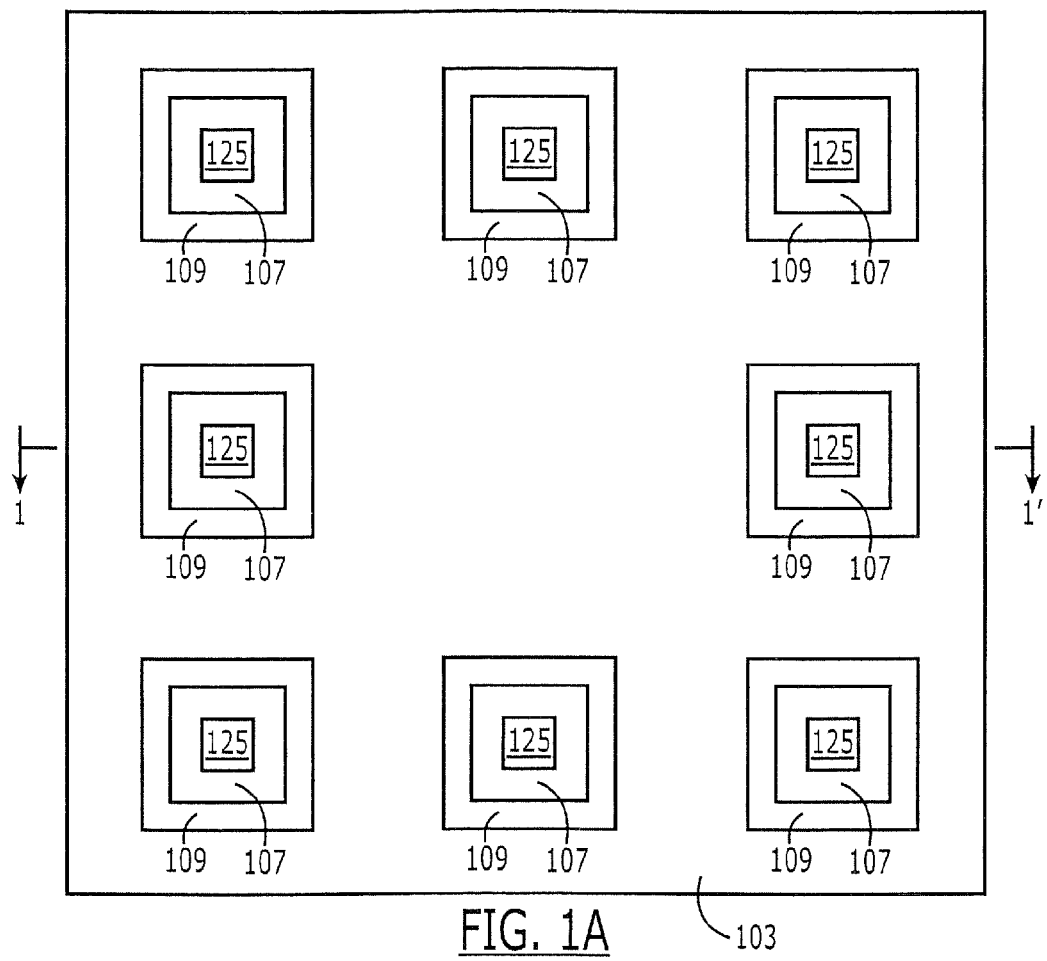
FIGS. 1A, 2A, and 3A are plan views illustrating operations of forming DMOSFET (double diffused Metal Oxide Semiconductor Field Effect Transistors) devices and intermediate structures thereof according to some embodiments of the present invention.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Multiple DMOSFET devices may be coupled in parallel and provided on a same heat sink to increase a current capacity of the resulting assembly. Even though control gates of the multiple DMOSFET devices of the assembly may be electrically connected to a same control signal line, a resulting load current through the DMOSFET devices may oscillate during switching due to imbalances between the parallel DMOSFET devices. Such imbalances may result from: variations of threshold voltages; variations of delay times; variations of switching times between DMOSFET devices of the assembly; and/or loop inductances and/or cross-coupled feedback between parallel DMOSFET devices of the assembly.

Such oscillations may be reduced by coupling a relatively small control gate resistor in series between the control gate of each DMOSFET device and the control signal line. These resistors may effectively provide individual current sources for the control gate of each DMOSFET device to provide dampening and to reduce cross-coupling. Values for such control gate resistors may be in the range of less than about 1 ohm to less than about 100 ohm depending on a number and current rating of the DMOSFET devices in the assembly. Adding discrete resistors to a module, however, may take up additional space and/or increase cost and/or complexity of the module.

According to embodiments of the present invention, an area of increased electrical resistance may be integrated into a gate electrode of a DMOSFET device. For example, perforations may be provided in the gate electrode to increase an electrical resistance between a gate contact area and an active area of the gate electrode. Because the gate electrode distributes the control signal across an active area of the DMOSFET device, the area of increased electrical resistance in the gate may effectively increase an electrical resistance along the signal pathway. Accordingly, the area of increased electrical resistance in the gate electrode may be used to replace an external control gate resistor. Stated in other words, a control gate resistor/resistance may be integrated within a control gate electrode of a DMOSFET device or any other device including a control gate electrode (such as a MESFET or MEtal Semiconductor Field Effect Transistor, a HEMT or High Electron Mobility Transistor, an HFET or Heterostructure Field Effect Transistor, MODFET or MOdulation-Doped Field Effect Transistor, etc.). Moreover, such an area of increased resistance may be provided by modifying a photolithography mask used to pattern the gate electrode of the DMOSFET device. In addition, resistances may be changed simply by providing a different gate electrode mask with different lengths/widths/densities/separations of the perforations.

FIGS. 1A-3A and 1B-3B are corresponding plan and cross sectional views illustrating operations of forming DMOSFET (double diffused Metal Oxide Semiconductor Field Effect Transistors) and structures thereof according to some embodiments of the present invention. As shown in FIGS. 2A, 2B, 3A, and 3B, for example, an insulated gate electrode 121 may include a plurality of perforations 171 therethrough to define an area of increased electrical resistance between a gate contact area of insulated gate electrode 121 and an active area of insulated gate electrode 121 opposite channel regions of semiconductor layer 101. The insulated gate electrode 121, for example, may be a degeneratively doped polysilicon gate electrode. By providing the area of increased electrical resistance (e.g., using perforations 171), an external resistor may be omitted from an assembly including DMOSFETs according to embodiments of the present invention.

Figure 2A:
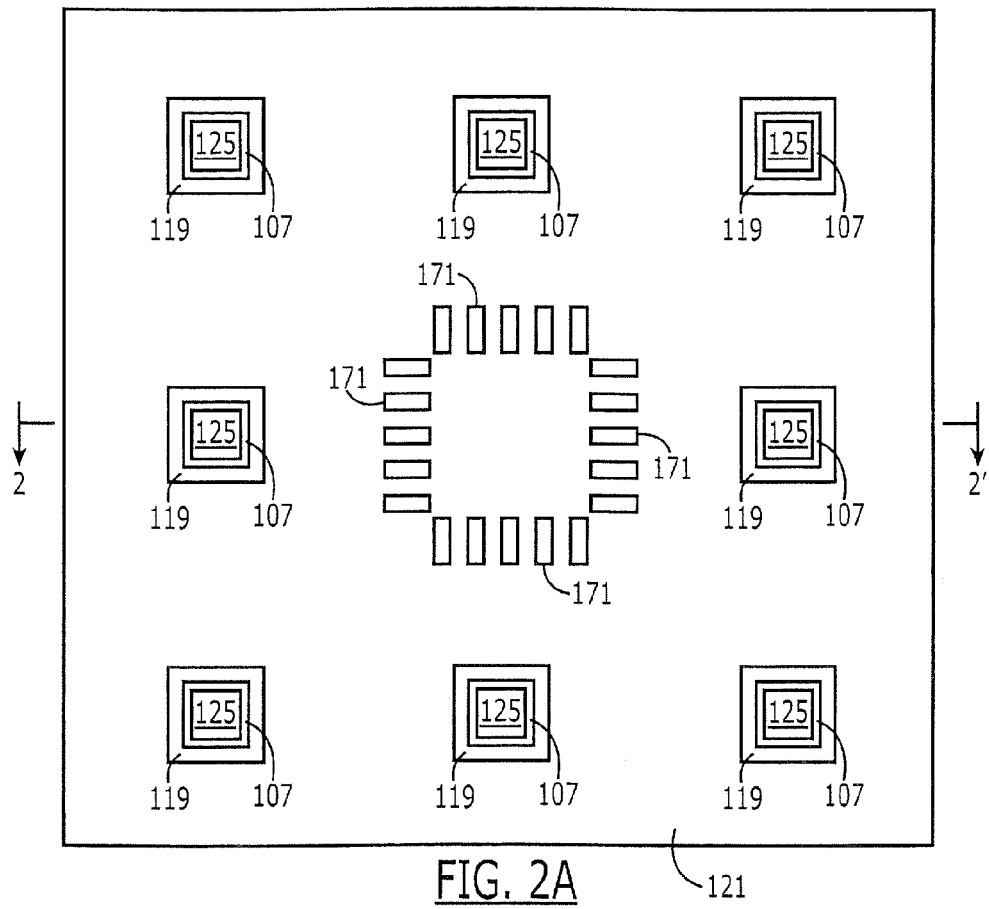
Figure 2B:
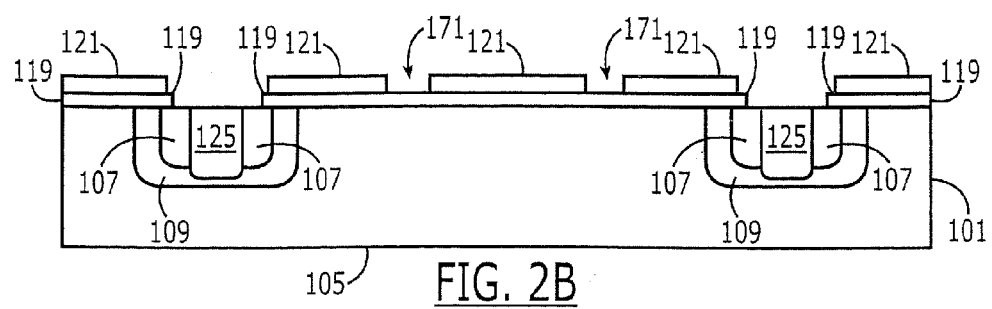
Figure 3A:
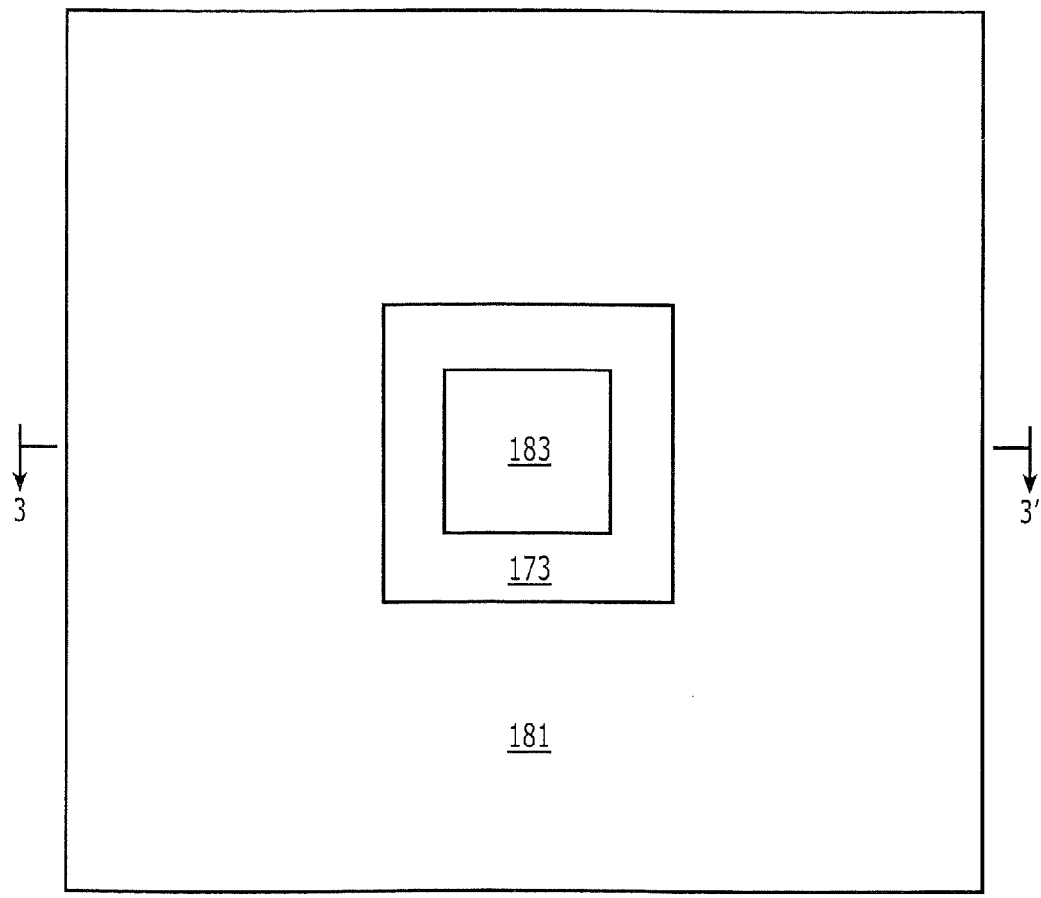
Figure 3B:
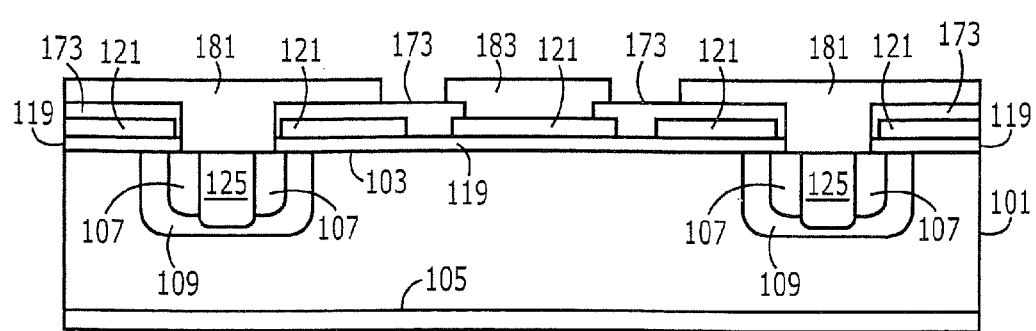
Figure 4:
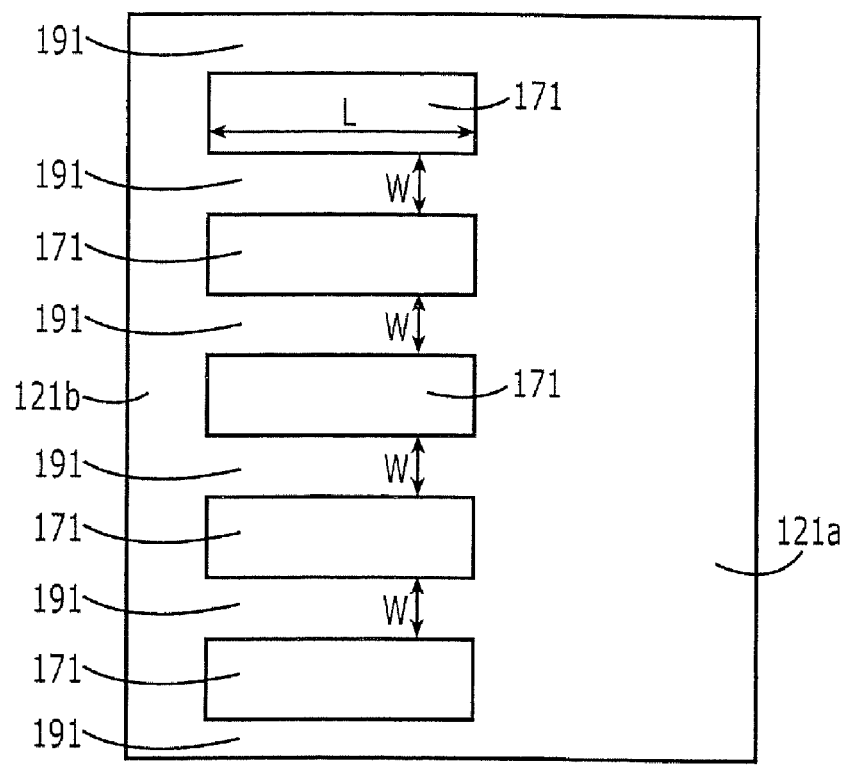
FIG. 4 is a greatly enlarged view of an area of an insulated gate electrode having increased electrical resistance according to some embodiments of the present invention.

FIG. 4 is a greatly enlarged view of an area of an insulated gate electrode 121 having increased electrical resistance provided using perforations 171 through insulated gate electrode 121 as shown in FIGS. 2A, 2B, 3A, and 3B. Accordingly, a plurality of separate and parallel electrical paths 191 may be provided through portions of insulated gate electrode 121 between perforations 171. As shown, a length of each electrical path 191 may be defined by a length L of the perforations 171, and a width W of each electrical path 191 may be defined by a distance between adjacent perforations 171. A resistance of the integrated gate resistor may be determined by the numbers, widths W, and lengths L of the electrical paths 191 defined between perforations 171. More particularly, a resistance of the integrated gate resistor may be determined using the following formula:

$R=(\rho_s \times L)/(\Sigma W)$, where $\rho_s$ is the sheet resistance of the material making up the insulated gate electrode, where L is the length of perforations 171, where W is the width of each individual electrical path 191, and where W is summed for the total number of current paths between the contact area of insulated gate electrode and active area of insulated gate electrode.

By way of example, if an integrated gate resistance of 5 ohm is intended, $\rho_s$ is 100 ohm/square, and the length L of each perforation is 100 micrometer, then $\Sigma W$ is 2000 micrometer. In this example, if W (i.e., the width of each current path 191 between adjacent perforation) is 5 micrometers, then 400 current paths may be provided to surround contact area of insulated gate electrode 121. Moreover, if a circumference of the area of increased resistance surrounding contact area of gate electrode 121 (i.e., the circumference of the contact area surrounded by perforations 171) is 5000 micrometers (e.g., 1250 micrometers per each side of a square defined by perforations 171 in the structure of FIG. 2A), then a repeat unit for each unit of one current path and one perforation may be 12.5 micrometers, and each perforation 171 may have a width of 7.5 micrometers. Embodiments of the present invention will be discussed in greater detail below with respect to operations of forming DMOSFET structures and intermediate structures thereof.

Figure 1B:
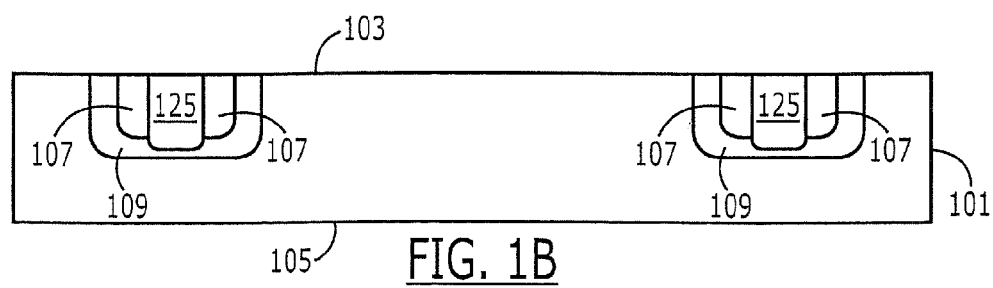
FIGS. 1B, 2B, and 3B are cross sectional views corresponding to the plan views of FIGS. 1A-3A.

Operations of forming a semiconductor device, such as a silicon carbide DMOSFET according to some embodiments of the present invention will now be discussed with respect to the plan views of FIGS. 1A, 2A, and 3A, and with respect to corresponding cross sectional views of FIGS. 1B, 2B, and 3B. As shown in FIGS. 1A and 1B, a semiconductor layer 101 (e.g., a single crystal silicon layer/substrate, a single crystal silicon carbide layer/substrate, etc.) may have a first conductivity type (e.g., n-type) and opposing surfaces 103 and 105. According to some embodiments of the present invention, semiconductor layer 101 may be a 4H—SiC polytype silicon carbide layer. Well regions 109 of a second conductivity type (e.g., p-type) may be formed in semiconductor layer 101, and source/drain terminal regions 107 of the first conductivity type (e.g., n-type) may be formed in well regions 109. As shown, well regions 109 may surround source/drain terminal regions 107, and a depth of well regions 109 into semiconductor layer 101 may be greater than a depth of source/drain terminal regions 107 into semiconductor layer 101, and the first and second conductivity types may be different. In addition, well contact regions 125 of the second conductivity type may be formed through central portions of source/drain terminal regions 107 to provide electrical coupling for well regions 109.

While not shown in FIGS. 1A and 1B, buried regions of the second conductivity type may be provided between lower portions of source/drain terminal regions 107 and lower boundaries of well regions 109; and/or an epitaxial layer (with terminal contact regions and well contact regions 125 therethrough) may be provided on a surface of semiconductor layer 101 after forming well regions 109 and source/drain terminal regions 107. Operations of forming well regions 109, source/drain terminal regions 107, and well contact regions 125 are discussed, for example, in U.S. application Ser. No. 12/412,448 entitled "Methods Of Forming Semiconductor Devices Including Epitaxial Layers And Related Structures" and filed Mar. 27, 2009, the disclosure of which is hereby incorporated herein in its entirety by reference. Each of the well regions 109, with associated source/drain terminal regions 107 and well contact regions 125, may define a unit cell structure. By providing a plurality of such unit cell structures in parallel as shown in FIGS. 1A and 1B, a current carrying capacity of the device may be increased.

Source/drain terminal regions 107 and layer 101 may be doped with an n-type element(s) from column V of the periodic table (e.g., nitrogen, phosphorus, etc.), and well regions 109 and well contact regions 125 may be doped with a p-type element(s) from column III of the periodic table (e.g., boron, aluminum, etc.). Source/drain terminal regions 107, for example, may be doped with nitrogen to reduce crystal damage at surface 103 of layer 101, and well regions 109 (and/or buried regions below source/drain terminal regions 107) may be doped with aluminum.

As shown in FIGS. 2A and 2B, gate insulating layer 119 and insulated gate electrode 121 may be formed as shown in FIGS. 2A and 2B. Gate insulating layer 119 may be a layer of silicon oxide, and gate electrode 121 may be a layer of degeneratively doped polycrystalline silicon (also referred to as polysilicon). Operations of forming gate insulating layers and/or gate electrodes, are discussed by way of example in: U.S. Pat. No. 7,074,643 to Ryu entitled "Silicon Carbide Power Devices With Self-Aligned Source And Well Regions And Methods Of Fabricating Same"; U.S. Pat. No. 7,381,992 to Ryu entitled "Silicon Carbide Power Devices With Self- Aligned Source And Well Regions"; U.S. Pat. No. 6,653,659 to Ryu et al. entitled "Silicon Carbide Inversion Channel MOSFETs"; U.S. Pat. No. 6,956,238 to Ryu et al. entitled "Silicon Carbide Power Metal-Oxide Semiconductor Field Effect Transistors Having A Shorting Channel And Methods Of Fabricating Silicon Carbide Metal-Oxide Semiconductor Field Effect Transistors Having A Shorting Channel"; and U.S. patent application Ser. No. 12/412,448 entitled "Methods Of Forming Semiconductor Devices Including Epitaxial Layers And Related Structures." The disclosures of each of the above referenced patents and applications are hereby incorporated herein in their entirety by reference.

For example, a continuous layer of a gate insulating material (e.g., silicon oxide) may be formed and then patterned to provide gate insulating layer 119 on surface 103 of semiconductor layer 101. More particularly, gate insulating layer 119 may be patterned to cover channels defined in outer portions of well region 109 and outer portions of source/drain terminal regions 107 while exposing inner portions of source/drain terminal regions 107 and well contact regions 125. After forming gate insulating layer 119, a continuous layer of a gate electrode material (e.g., a doped polycrystalline semiconductor material such as doped polysilicon) may be formed and then patterned to provide insulated gate electrode 121 on gate insulating layer 119. More particularly, insulated gate electrode 121 may be patterned to expose inner portions of source/drain terminal regions 107 and well contact regions 125 and to provide perforations 171 defining an area of increased electrical resistance between a contact region of insulated gate electrode 121 and an active region of insulated gate electrode 121. Accordingly, a single photolithographic mask/etch operation may be performed to provide insulated gate electrode 121 with the area of increased electrical resistance. The area of increased electrical resistance may thus be provided by revising an existing patterning mask for insulated gate electrode 121 without adding any additional fabrication steps/operations.

As shown in FIGS. 3A and 3B, insulating layer 173 (e.g., a silicon oxide layer) may be formed on insulated gate electrode 121, and then source/drain contact 181 and gate contact 183 may be formed. More particularly, insulating layer 173 may be patterned to electrically isolate insulated gate electrode 121 from source/drain contact 181 while exposing inner portions of source/drain terminal regions 107 and well contact regions 125 and while exposing a contact area of insulated gate electrode 121. Source/drain contact 181 may thus provide an ohmic electrical contact with all source/drain terminal regions 107 and with all well contact regions 125 of the semiconductor device. Similarly, gate contact 183 may provide ohmic electrical contact with a contact area of insulated gate electrode 121.

Moreover, source/drain contact 181 and gate contact 183 may be formed simultaneously. For example, a continuous metal layer or layers (e.g., a nickel layer and/or an aluminum layer) may be formed on insulating layer 173, on exposed portions of source/drain terminal regions 107, on exposed well contact regions 125, and on contact area of insulated gate electrode 121. The continuous metal layer or layers may then be photo lithographically patterned to provide separate source/drain contacts 181 and gate contacts 183. Source/drain contacts 181 and gate contacts 183, for example, may include a first metal layer (e.g., nickel) to provide ohmic contact with semiconductor material and a second metal layer or layers (e.g., copper, aluminum, gold, platinum, etc.) to provide improved electrical conductivity, suitability for wire and/or solder bonding, and/or passivation. In addition, source/drain contact 185 may be provided on surface 105 of semiconductor layer 101 to provide a vertical conduction path through semiconductor layer 101 between source/drain contacts 181 and 185. Source/drain contact 185, for example, may include a first metal layer (e.g., nickel) to provide ohmic contact with semiconductor material and a second metal layer or layers (e.g., copper, aluminum, gold, platinum, etc.) to provide improved electrical conductivity, suitability for wire and/or solder bonding, and/or passivation. While not shown in FIG. 3B, semiconductor layer 101 may include a relatively highly doped region of the first conductivity type adjacent surface 105 to improve electrical contact with source/drain contact 185.

Operations of forming ohmic source/drain contacts are discussed by way of example in: U.S. Pat. No. 7,074,643 to Ryu entitled "Silicon Carbide Power Devices With Self-Aligned Source And Well Regions And Methods Of Fabricating Same"; U.S. Pat. No. 7,381,992 to Ryu entitled "Silicon Carbide Power Devices With Self-Aligned Source And Well Regions"; U.S. Pat. No. 6,653,659 to Ryu et al. entitled "Silicon Carbide Inversion Channel MOSFETs"; U.S. Pat. No. 6,956,238 to Ryu et al. entitled "Silicon Carbide Power Metal-Oxide Semiconductor Field Effect Transistors Having A Shorting Channel And Methods Of Fabricating Silicon Carbide Metal-Oxide Semiconductor Field Effect Transistors Having A Shorting Channel"; and U.S. patent application Ser. No. 12/412,448 entitled "Methods Of Forming Semiconductor Devices Including Epitaxial Layers And Related Structures." The disclosures of each of the above referenced patents and applications are hereby incorporated herein in their entirety by reference.

In the DMOSFET device of FIGS. 3A and 3B, insulated gate electrode 121 may thus be used to control a conductivity of channel regions through well regions 109 (adjacent surface 103 of semiconductor layer 101) responsive to an electrical signal applied through gate contact 183. Accordingly, when the DMOSFET is turned on, current may flow between source/drain contacts 181 and 185 through source/drain terminal regions 107, channels of well regions 109, and layer 101. When the DMOSFET is turned off, current flow between source/drain contacts 181 and 185 may be blocked.

The DMOSFET device of FIGS. 3A and 313 may be an n-channel device according to some embodiments of the present invention by providing that semiconductor layer 101 and source/drain terminal regions 107 have n-type conductivity and by providing that well regions 109 and well contact regions 125 have p-type conductivity. According to other embodiments of the present invention, the DMOSFET device of FIGS. 3A and 3B may be a p-channel device by providing that semiconductor layer 101 and source/drain terminal regions 107 have p-type conductivity and by providing that well regions 109 and well contact regions 125 have n-type conductivity.

Figure 5:
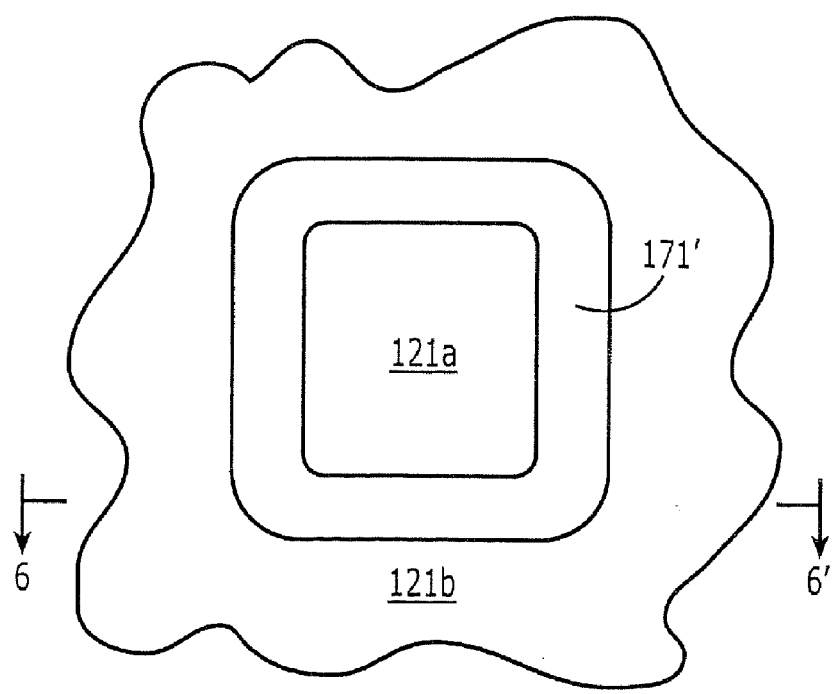
FIG. 5 is a plan view of a central portion of insulated gate electrode from FIG. 2A according to some embodiments of the present invention.
Figure 6A:
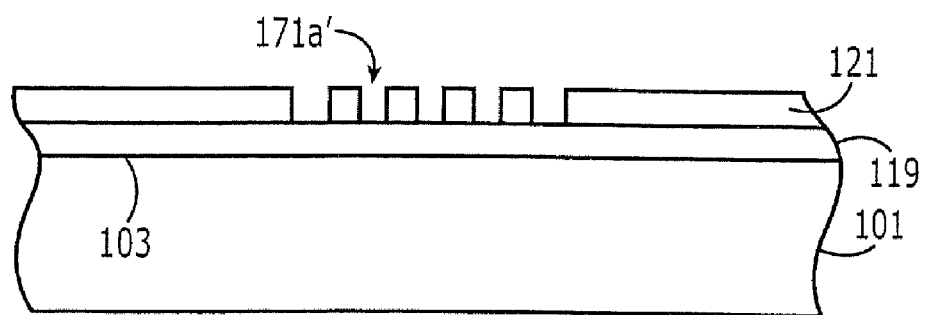
FIGS. 6A-C are cross sectional views of gate electrode structures according to different embodiments of the present invention.
Figure 6B:
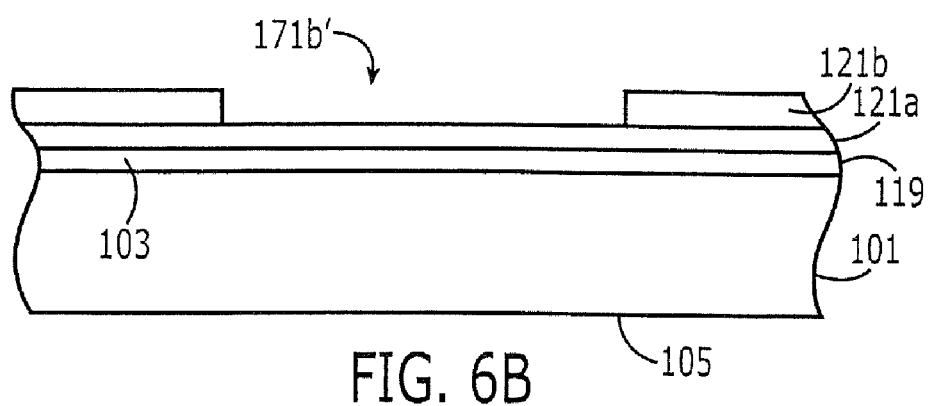
Figure 6C:
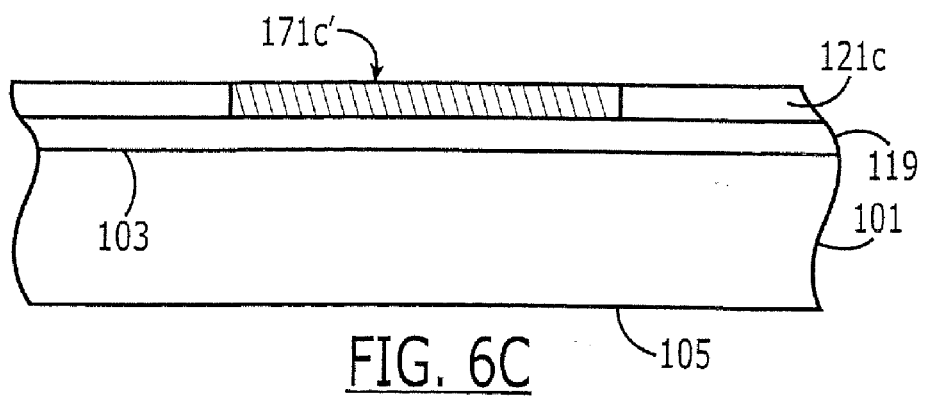

FIG. 5 is a plan view of a central portion of insulated gate electrode 121 from FIG. 2A generically illustrated with an area of increased electrical resistance 171' between contact area 121a of insulated gate electrode 121 and active area 121b of insulated gate electrode 121. FIGS. 6A, 6B, and 6C are alternative cross sectional views taken along section line 6-6' of FIG. 5 illustrating areas of increased electrical resistance according to different embodiments of the present invention. Gate electrode structures of FIGS. 5, 6A, 6B, and/or 6C may be substituted for gate electrode structures of FIGS. 2A, 2B, 3A, and 3B.

As shown in FIG. 6A, an area of increased electrical resistance 171a' may be provided using perforations through insulated gate electrode 121 as discussed above with respect to FIGS. 2A and 2B. The difference between the perforations shown in FIGS. 2B and 6A is that the section lines from which these cross sectional views are taken are provided at different locations. In other words, FIG. 2B shows a cross section through a central portion of contact area, while FIG. 6A shows a cross section through a length of the area of increased electrical resistance. As discussed above, the perforations through insulated gate electrode 121 may be patterned using a photolithographic mask/etch operation used to expose source/drain terminal regions 107 and well contact regions 125.

As shown in FIG. 6B, an area of increased electrical resistance 171b' may be provided by selectively reducing a thickness of the insulated gate electrode in the area of increased electrical resistance. The insulated gate electrode, for example, may include a first layer 121a (e.g., a doped polysilicon layer) and a second layer 121b (e.g., a metal layer, a metal silicide layer, etc.) different than the first layer 121a. Accordingly, by removing the second layer 121b from the area of increased electrical resistance, a thickness of the insulated gate electrode may be reduced thereby increasing an electrical resistance thereof. By providing different materials for the first and second layers 121a and 121b, the first layer 121a may serve as an etch stop when patterning the second layer 121b. According to other embodiments of the present invention, the insulated gate electrode may be provided using a single layer of a same conductive material, and the area of increased electrical resistance 171b' may be formed using a selective etch back operation to thereby reduce a thickness of the insulated gate electrode in the area of increased electrical resistance. A full thickness of insulated gate electrode including layers 121a and 121b may thus be maintained in contact and active areas 121a and 121b, while a thickness of insulated gate electrode may be reduced in the area of increased electrical resistance 171b'.

As shown in FIG. 6C, an area of increased electrical resistance 171c' may be provided by providing areas of insulated gate electrode 121c having different resistivities. With a polysilicon insulated gate electrode, for example, different resistivities may be provided by providing different dopant concentrations. For example, insulated gate electrode 121c may be implanted with a relatively low dopant concentration across an entirety thereof, and then, a mask may be provided on the area of increased electrical resistance 171c' before selectively implanting a relatively high dopant concentration for contact and active areas 121b and 121a of insulated gate electrode 121c. Accordingly, a resistivity of the area of increased electrical resistance 171c' may be greater than resistivities of other areas of insulated gate electrode 121c. While perforation, different thickness, and different resistivities are discussed by way of example, other techniques may be employed to selectively increase an electrical resistance of portions of gate electrode 121.

As shown in FIGS. 1A-B, 2A-B, and 3A-B, a metal gate contact 183 may be provided on a contact area of insulated gate electrode 121 (surrounded by perforations 171) in a central portion of the device surrounded by active areas of the device including unit cell structures (defined by well regions 109, source/drain terminal regions 107, and well contact regions 125). According to other embodiments of the present invention, a metal gate contact may include metal gate runners to more quickly distribute gate signals across active areas of the insulated gate electrode. In a structure including gate runners, a wire bond area of the metal gate contact may be provided at a periphery of the device with runners of the metal gate contact extending across the gate electrode between unit cell structures. Accordingly, the areas of increased electrical resistance of the insulated gate electrode may extend along a perimeter of the contact area of the insulated gated electrode having both the wire bond and gate runner portions of metal gate contact thereon.

Figure 7A:
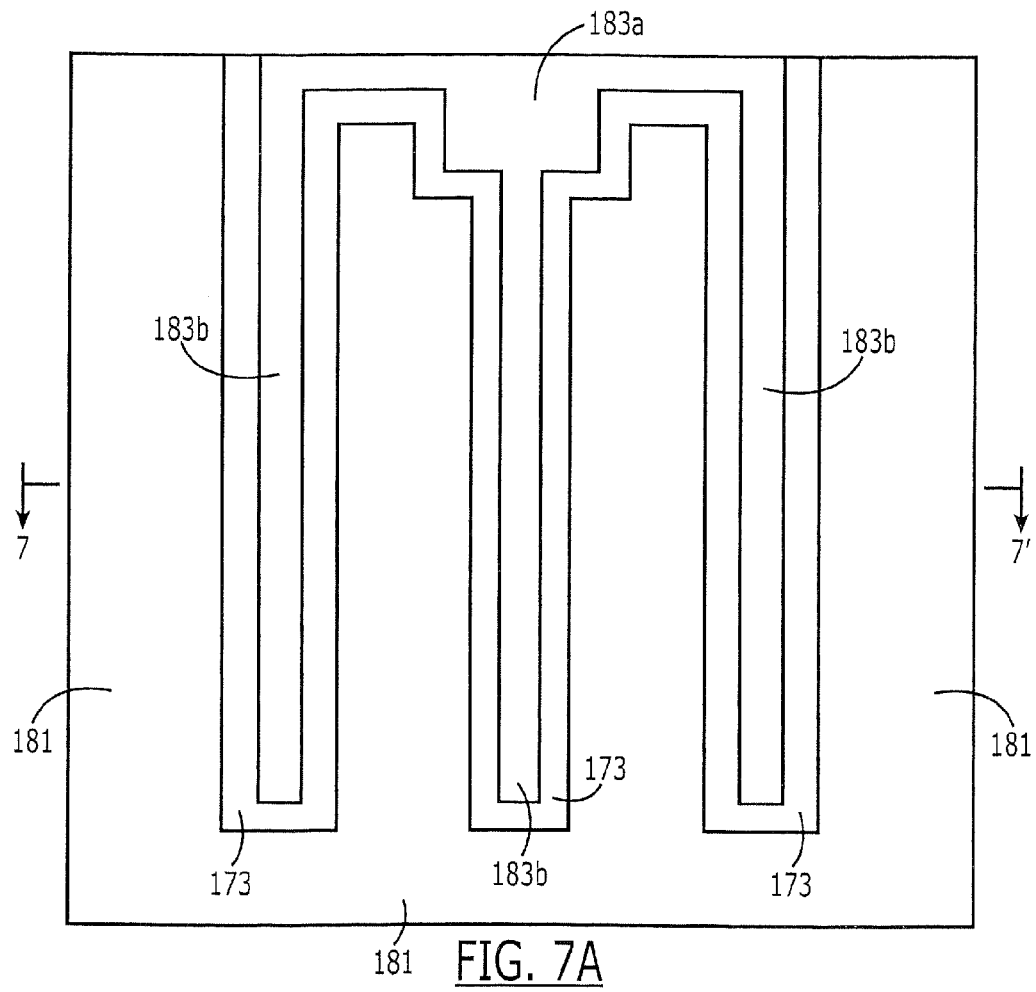
FIGS. 7A and 7B are corresponding plan and cross sectional views illustrating a DMOSFET device including metal gate runners according to embodiments of the present invention.
Figure 7B:
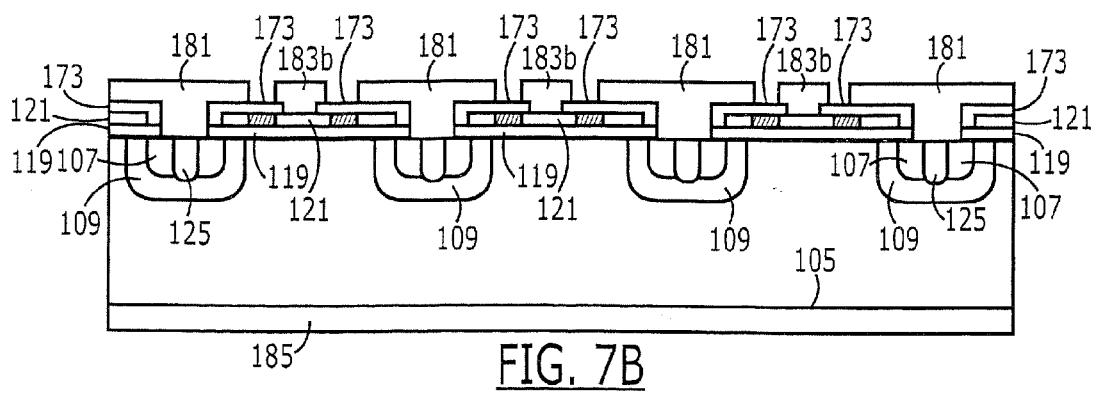
Figure 8:
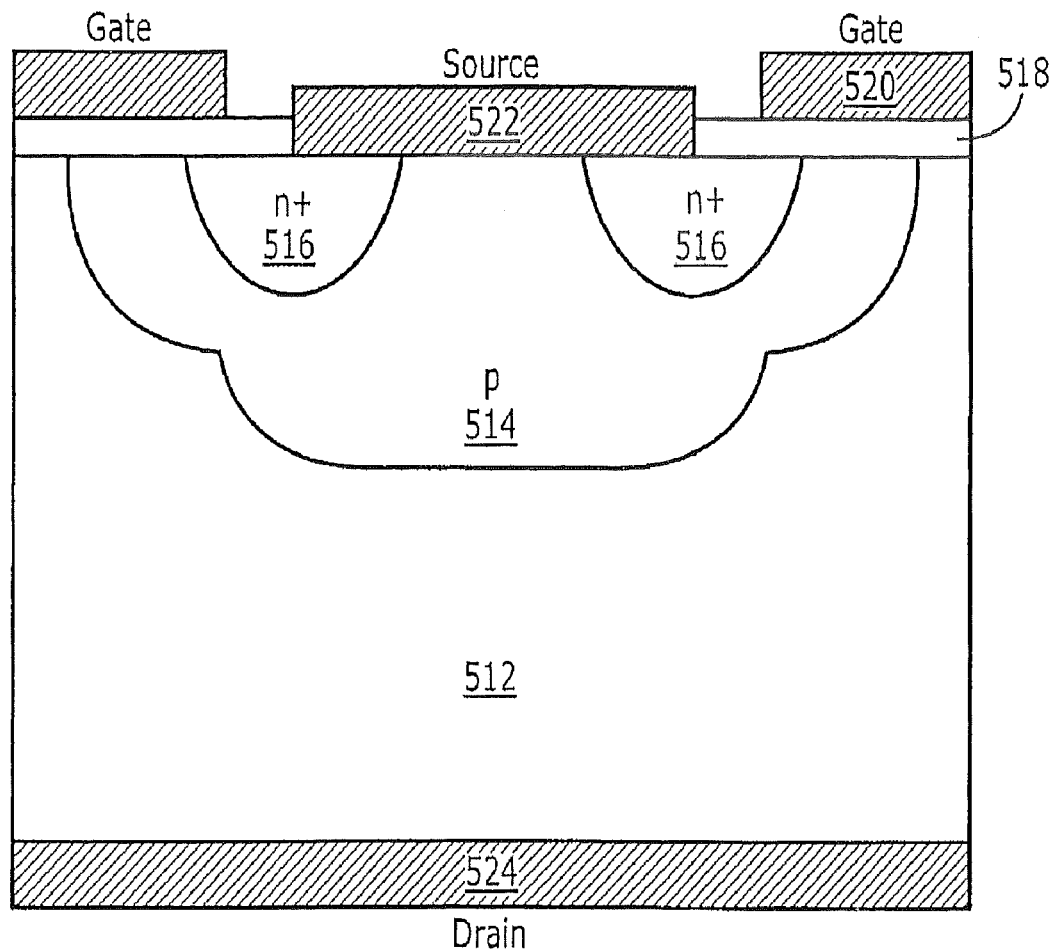
FIG. 8 is a cross-sectional view of a conventional DMOSFET.

FIGS. 7A and 7B are respective plan and cross sectional views illustrating a DMOSFET device including an insulated gate electrode with areas of increased electrical resistance and metal gate runners according to additional embodiments of the present invention. Because FIGS. 7A and 7B show a rearrangement of elements of FIGS. 3A and 3B, the same reference numbers will be used as appropriate to identify elements that are the same as those illustrated in FIGS. 3A and 3B.

In particular, the metal gate contact may include wire bond area 183a and metal gate runners 183b to distribute gate signals across insulated gate electrode 121. In addition, insulated gate electrode 121 may include areas of increased electrical resistance (shown in FIG. 7B as cross hatched portions of insulated gate electrode 121) separating contact areas of insulated gate electrode 121 (in contact with wire bond area 183a and runners 183b) from active areas of insulated gate electrode 121 (adjacent well regions 109). The areas of increased electrical resistance of insulated gate electrodes 121 may be provided as discussed above with respect to FIGS. 2A-B, 3A-B, 4, 5, and 6A-B. For example, the areas of increased electrical resistance may be provided using perforations through insulated gate electrode 121, as areas of reduced thickness of insulated gate electrode 121, or as areas of lower conductivity (e.g., by providing a lower doping concentration) of insulated gate electrode 121. Moreover the metal gate contact (including wire bond area 183a and runners 183b) and source/drain contact 181 may be patterned from a same metal layer (e.g., an aluminum layer) having a thickness of at least about 1 micrometer, and more particularly, at least about 4 micrometer.

As shown in FIG. 7A, wire bond area 183a may be provided at a periphery of the DMOSFET device with metal gate runners 183b extending from one edge of the device toward an opposite edge of the device. Other layouts, however, may be provided. For example, wire bond area 183b may be provided in a central portion of the device with metal gate runners 183a extending outwardly therefrom. While FIGS. 7A and 7B show a single column of unit cells (with each unit cell including well region 109, source/drain terminal regions 107, and well contact region 125) between adjacent runners 183b, any number of columns of unit cells may be provided between adjacent runners 183b.

As discussed above, a silicon carbide DMOSFET may be provided according to some embodiments of the present invention. Gate electrodes with areas of increased electrical resistance, however, may be used in other electronic device structures according to other embodiments of the present invention. By way of example, each of the structures of FIGS. 1A-C, 2A-C, 4, 5, 6A-C, and 7A-B may be implemented as an insulated gate bipolar transistor (IGBT) with the addition of a collector region of layer 101 adjacent surface 105. More particularly, terminal regions 107 of the first conductivity type (e.g., n-type) may provide emitter regions of an insulated gate bipolar transistor (IGBT), and a highly doped portion of layer 101 adjacent surface 105 having the second conductivity type (e.g., p-type) may provide a collector region of the IGBT. IGBT structures are discussed by way of example in U.S. Publication No. 2008/0105949 to Zhang et al. entitled "High Power Insulated Gate Bipolar Transistors." According to other embodiments of the present invention, gate electrodes with areas of increased electrical resistance may be used in other field effect transistor structures such as a MESFET (MEtal Semiconductor Field Effect Transistor), a HEMT (High Electron Mobility Transistor), an HFET (Heterostructure Field Effect Transistor), a MODFET (MOdulation-Doped Field Effect Transistor), etc.

Moreover, while n-channel devices are discussed by way of example, other device types may be implemented according to other embodiments of the present invention. For example, p-channel devices may be provided according to other embodiments of the present invention by reversing conductivity types of the different semiconductor regions, layers, and substrates discussed above. An n-channel DMOSFET may be provided as discussed above by providing the first conductivity type as n-type so that semiconductor layer 101 and source/drain terminal regions 107 have n-type conductivity, and by providing the second conductivity type as p-type so that well regions 109 and well contact regions 125 have p-type conductivity. According to other embodiments of the present invention, a p-channel DMOSFET may be provided as discussed above by providing the first conductivity type as p-type so that semiconductor layer 101 and source/drain terminal regions 107 have p-type conductivity, and by providing the second conductivity type as n-type so that well regions 109 and well contact regions 125 have n-type conductivity. Moreover, n-channel and p-channel IGBTs may be provided according to still other embodiments of the present invention.

While silicon carbide layers/substrates are discussed above by way of example, other semiconductor materials (e.g., silicon, gallium nitride, gallium arsenide, etc.) may be used according to other embodiments of the present invention. In addition, horizontal devices may be provided according to still other embodiments of the present invention by providing all terminal regions and contacts on a same surface of semiconductor layer 101.

In the drawings and specification, there have been disclosed embodiments of the invention and, although specific terms are employed, they are used in a generic and descriptive sense only and not for purposes of limitation, the scope of the invention being set forth in the following claims.

That which is claimed is:

1. A semiconductor device comprising:
   a semiconductor layer including a first channel and a first source/drain terminal region adjacent the first channel and including a second channel and a second source/drain terminal region adjacent the second channel, wherein the first and second channel regions are spaced apart;
   a gate electrode including an active area on the first and second spaced apart channels and a contact area, wherein the active area of the gate electrode extends continuously between the first and second spaced apart channels and wherein the gate electrode includes an area of increased electrical resistance between the contact area and the active area; and
   a metal contact on and electrically coupled to the contact area of the gate electrode opposite the semiconductor layer;
   wherein the gate electrode includes a layer of a first conductive material on the active area, on the contact area, and on the area of increased electrical resistance, and wherein the gate electrode includes a layer of a second conductive material on the active area, wherein the area of increased electrical resistance is free of the layer of the second conductive material, wherein the layer of the first conductive material extends continuously in an entire area between the contact area and the active area without interruption, wherein the area of increased electrical resistance is between the contact area and both of the first and second channels, and wherein the layers of the first and second conductive materials extend continuously between the first and second channels.

2. The semiconductor device according to claim 1 further comprising:
   a gate insulating layer between the gate electrode and the semiconductor layer.

3. A semiconductor device comprising:
   an insulating layer;
   a semiconductor electrode on the insulating layer wherein an area of increased electrical resistance separates a contact area of the semiconductor electrode from an active area of the semiconductor electrode; and
   a metal contact on and electrically coupled to the contact area of the semiconductor electrode opposite the insulating layer;
   wherein the semiconductor electrode includes a layer of a first conductive material on the active area, on the contact area, and on the area of increased electrical resistance, and wherein the semiconductor electrode includes a layer of a second conductive material on the active area, wherein the area of increased electrical resistance is free of the layer of the second conductive material, wherein the layer of the first conductive material extends continuously in an entire area between the contact area and the active area without interruption, wherein the area of increased electrical resistance surrounds the contact area of the semiconductor electrode on all sides, and wherein the layer of the first conductive material surrounds the contact area of the semiconductor electrode without interruption.

4. The semiconductor device according to claim 3 wherein the area of increased electrical resistance surrounds the contact area of the semiconductor electrode.

5. The semiconductor device according to claim 3 wherein the semiconductor electrode comprises a polycrystalline semiconductor electrode.

6. The semiconductor device according to claim 3 further comprising:
   a semiconductor layer having a first conductivity type, wherein the insulating layer is between the semiconductor layer and the semiconductor electrode and wherein the semiconductor layer includes active and contact areas corresponding to active and contact areas of the semiconductor electrode;
   a first well region having a second conductivity type in the active area of the semiconductor layer wherein the first and second conductivity types are different;
   a second well region having the second conductivity type in the active area of the semiconductor layer wherein the first and second well regions are spaced apart;
   a first source/drain terminal region having the first conductivity type adjacent at least portions of the first well region wherein portions of the first well region between the first source/drain terminal region and an outer perimeter of the first well region adjacent a surface of the semiconductor layer define a first channel wherein the semiconductor electrode is on portions of the insulating layer opposite the first channel; and
   a second source/drain terminal region having the first conductivity type adjacent at least portions of the second well region wherein portions of the second well region between the second source/drain terminal region and an outer perimeter of the second well region adjacent a surface of the semiconductor layer define a second channel wherein the semiconductor electrode is on portions of the insulating layer opposite the second channel, and wherein the layers of the first and second conductive materials extend continuously between the first and second channels.

7. A semiconductor device comprising:
a semiconductor layer having a first conductivity type, wherein the semiconductor layer includes an active area and a gate contact area;
a well region having a second conductivity type in the active area wherein the first and second conductivity types are different;
a source/drain terminal region having the first conductivity type adjacent at least portions of the well region wherein portions of the well region between the source/drain terminal region and an outer perimeter of the well region define a channel;
a gate insulating layer on the channel, on the active area outside the well region, and on the gate contact area; and
a gate electrode on the gate insulating layer opposite the channel, opposite the active area outside the well region, and opposite the gate contact area, wherein the gate electrode includes an area of increased electrical resistance between the gate contact area and the channel, wherein the gate electrode includes a layer of a first conductive material on the active area, on the contact area, and on the area of increased electrical resistance, and wherein the gate electrode includes a layer of a second conductive material on the active area, wherein the area of increased electrical resistance is free of the layer of the second conductive material, wherein the layer of the first conductive material extends continuously in an entire area between the contact area and the active area without interruption, wherein the area of increased electrical resistance surrounds the contact area of the gate electrode on all sides, and wherein the layer of the first conductive material surrounds the contact area of the semiconductor electrode without interruption.

8. The semiconductor device according to claim 7 further comprising:
a metal contact on the gate electrode opposite the gate contact area of the semiconductor layer, wherein the area of increased electrical resistance surrounds an area of contact between the metal contact and the gate electrode.

9. The semiconductor device according to claim 7 wherein the gate electrode comprises a semiconductor gate electrode.

10. The semiconductor device according to claim 7 wherein the well region comprises a first well region, wherein the source/drain terminal region comprises a first source/drain terminal region, and wherein the channel comprises a first channel, the semiconductor device further comprising:
a second well region having the second conductivity type spaced apart from the first well region in the active area; and
a second source/drain terminal region having the first conductivity type adjacent at least portions of the second well region wherein portions of the second well region between the second source/drain terminal region and an outer perimeter of the second well region define a second channel, wherein the gate insulating layer is on the first and second channels and on the active area between the first and second well regions, wherein the gate electrode is on the gate insulating layer opposite the first and second channels and opposite the active area between the first and second well regions wherein the area of increased electrical resistance is between the contact area and both of the first and second channels, and wherein the layers of the first and second conductive materials extend continuously between the first and second channels.

11. The semiconductor device according to claim 7 further comprising:
a first source/drain electrode coupled to the first and second source/drain regions; and
a second source/drain electrode on the semiconductor layer wherein the semiconductor layer is between the first and second source/drain electrodes.

12. A semiconductor device comprising:
a semiconductor layer including a channel and a terminal region adjacent the channel;
a gate electrode including an active area on the channel and a contact area, wherein the gate electrode includes an area of increased electrical resistance between the contact area and the active area; and
a metal contact on and electrically coupled to the contact area of the gate electrode opposite the semiconductor layer;
wherein the gate electrode includes a layer of a first conductive material on the active area, on the contact area, and on the area of increased electrical resistance, and wherein the gate electrode includes a layer of a second conductive material on the active area, wherein the area of increased electrical resistance is free of the layer of the second conductive material, and wherein the layer of the first conductive material extends continuously between the contact area and the active area without interruption;
wherein the layer of the first conductive material surrounds the contact area without interruption in the area of increased electrical resistance.

13. The semiconductor device according to claim 12 wherein the layer of the first conductive material comprises polysilicon, wherein the layer of the second conductive material comprises a metal, and wherein the layer of the second conductive material is on the contact area between the metal contact and the layer of the first conductive material.

14. A semiconductor device comprising:
a semiconductor layer including a channel and a terminal region adjacent the channel;
a gate electrode including an active area on the channel and a contact area, wherein the gate electrode includes an area of increased electrical resistance between the contact area and the active area, wherein the gate electrode includes a layer of a first conductive material on the active area, on the contact area, and on the area of increased electrical resistance, and wherein the gate electrode includes a layer of a second conductive material on the active area, wherein the area of increased electrical resistance is free of the layer of the second conductive material, and wherein the layer of the first conductive material extends continuously between the contact area and the active area without interruption;
a metal contact on and electrically coupled to the contact area of the gate electrode opposite the semiconductor layer wherein the metal contact comprises a metal gate contact;
an insulating layer on the active area of the gate electrode and on the area of increased electrical resistance, wherein the gate electrode is between the insulating layer and the semiconductor layer, and wherein portions of the metal gate contact extend onto portions of the insulating layer opposite the semiconductor layer; and
a metal terminal contact electrically coupled to the terminal region, wherein the metal terminal contact extends on the insulating layer so that the insulating layer is between the metal terminal contact and the gate electrode, and wherein metal terminal contact and the metal contact comprise a same material and have a same thickness.

15. A semiconductor device comprising:
an insulating layer;
an electrode on the insulating layer wherein an area of increased electrical resistance separates a contact area of the electrode from an active area of the electrode; and
a metal contact on and electrically coupled to the contact area of the electrode opposite the insulating layer;
wherein the electrode includes a layer of a first conductive material on the active area, on the contact area, and on the area of increased electrical resistance, and wherein the electrode includes a layer of a second conductive material on the active area, wherein the area of increased electrical resistance is free of the layer of the second conductive material, and wherein the layer of the first conductive material extends continuously between the contact area and the active area without interruption; and
wherein the layer of the first conductive material surrounds the contact area without interruption in the area of increased electrical resistance.

16. The semiconductor device according to claim 15 wherein the layer of the first conductive material comprises polysilicon, wherein the layer of the second conductive material comprises a metal, and wherein the layer of the second conductive material is on the contact area between the metal contact and the layer of the first conductive material.

17. A semiconductor device comprising:
a semiconductor layer having a first conductivity type, wherein the semiconductor layer includes an active area and a gate contact area;
a well region having a second conductivity type in the active area wherein the first and second conductivity types are different;
a source/drain terminal region having the first conductivity type adjacent at least portions of the well region wherein portions of the well region between the source/drain terminal region and an outer perimeter of the well region define a channel;
a gate insulating layer on the channel, on the active area outside the well region, and on the gate contact area; and
a gate electrode on the gate insulating layer opposite the channel, opposite the active area outside the well region, and opposite the gate contact area, wherein the gate electrode includes an area of increased electrical resistance between the gate contact area and the channel, wherein the gate electrode includes a layer of a first conductive material on the active area, on the contact area, and on the area of increased electrical resistance, and wherein the gate electrode includes a layer of a second conductive material on the active area, wherein the area of increased electrical resistance is free of the layer of the second conductive material, and wherein the layer of the first conductive material extends continuously between the contact area and the active area without interruption;
wherein the layer of the first conductive material surrounds the gate contact area without interruption in the area of increased electrical resistance.

18. The semiconductor device according to claim 17 wherein the layer of the first conductive material comprises polysilicon, wherein the layer of the second conductive material comprises a metal, and wherein the layer of the second conductive material is on the gate contact area.

19. A semiconductor device comprising:
a semiconductor layer having a first conductivity type, wherein the semiconductor layer includes an active area and a gate contact area;
a well region having a second conductivity type in the active area wherein the first and second conductivity types are different;
a source/drain terminal region having the first conductivity type adjacent at least portions of the well region wherein portions of the well region between the source/drain terminal region and an outer perimeter of the well region define a channel;
a gate insulating layer on the channel, on the active area outside the well region, and on the gate contact area;
a gate electrode on the gate insulating layer opposite the channel, opposite the active area outside the well region, and opposite the gate contact area, wherein the gate electrode includes an area of increased electrical resistance between the gate contact area and the channel, wherein the gate electrode includes a layer of a first conductive material on the active area, on the contact area, and on the area of increased electrical resistance, and wherein the gate electrode includes a layer of a second conductive material on the active area, wherein the area of increased electrical resistance is free of the layer of the second conductive material, and wherein the layer of the first conductive material extends continuously between the contact area and the active area without interruption;
an interlayer insulating layer on the gate electrode opposite the channel and opposite the active area outside the well region, and on the area of increased electrical resistance, wherein the gate electrode is between the interlayer insulating layer and the semiconductor layer;
a metal gate contact on and electrically coupled to the gate contact area of the gate electrode, wherein portions of the metal gate contact extend onto portions of the interlayer insulating layer opposite the semiconductor layer; and
a metal source/drain terminal contact electrically coupled to the terminal region wherein the metal terminal contact extends on the insulating layer so that the insulating layer is between the metal terminal contact and the gate electrode, and wherein metal terminal contact and the metal contact comprise a same material and have a same thickness.

* * * * *

UNITED STATES PATENT AND TRADEMARK OFFICE
CERTIFICATE OF CORRECTION

PATENT NO. : 8,314,462 B2  
APPLICATION NO. : 12/510523  
DATED : November 20, 2012  
INVENTOR(S) : Hull et al.

It is certified that error appears in the above-identified patent and that said Letters Patent is hereby corrected as shown below:

In the Specifications

Column 10, Line 41: Please correct "and 313 may be" to read -- and 3B may be --

Signed and Sealed this
Fourth Day of June, 2013

Teresa Stanek Rea
*Acting Director of the United States Patent and Trademark Office*